(12) United States Patent
Tsai et al.

(10) Patent No.: US 6,195,258 B1
(45) Date of Patent: Feb. 27, 2001

(54) THERMAL BOARD USED FOR BONDING WIRES IN SEMICONDUCTOR MANUFACTURING PROCESS

(75) Inventors: Yu-Fang Tsai; Chin-Chen Wang, both of Kaohsiung (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 0 days.

(21) Appl. No.: 09/384,929

(22) Filed: Aug. 26, 1999

(51) Int. Cl.[7] .................................................. H05K 7/20

(52) U.S. Cl. .......................... 361/704; 361/688; 361/707; 361/717; 361/718; 257/666; 257/670; 257/706; 165/80.2; 165/185

(58) Field of Search ..................................... 361/688, 704, 361/707, 712, 713, 714, 717, 718; 257/666–670, 675, 706, 707, 713, 717, 719, 720; 165/80.2, 80.3, 185

(56) References Cited

U.S. PATENT DOCUMENTS

| 4,829,403 | * | 5/1989 | Harding ............................... 361/704 |
| 5,394,298 | * | 2/1995 | Sagisaka ............................. 361/704 |
| 5,448,105 | * | 9/1995 | Katoh et al. ........................ 257/666 |
| 5,822,848 | * | 10/1998 | Chiang ................................. 29/827 |
| 5,915,166 | * | 6/1999 | Corisis et al. ...................... 438/106 |
| 5,936,837 | * | 8/1999 | Scribner et al. ..................... 361/704 |

* cited by examiner

Primary Examiner—Leo P. Picard
Assistant Examiner—Boris L. Chervinsky
(74) Attorney, Agent, or Firm—Kolisch Hartwell Dickinson McCormack & Heuser

(57) ABSTRACT

A thermal board is used for bonding wires in semiconductor manufacturing process for providing high temperature to increase the wire bonding efficiency while preventing the die paddle of a lead frame from being oxidized. The thermal board has a base board and a platform disposed on the base board. The platform has a center portion defined therein a chamber to receive the die paddle. A plurality of supporting posts are formed on the bottom of the chamber to support the die paddle so that the die paddle does not directly contact with the bottom of the chamber.

10 Claims, 4 Drawing Sheets

THERMAL BOARD USED FOR BONDING WIRES IN SEMICONDUCTOR MANUFACTURING PROCESS

BACKGROUND OF THE INVENTION

1. Field of the Invention

The present invention relates to the structure of a thermal board used for bonding wires in semiconductor manufacturing process, and more particularly, to such a thermal board which can provide high temperature to increase the wire bonding efficiency while preventing the die paddle of a lead frame from being oxidized.

2. Description of Related Art

In a semiconductor manufacturing process, semiconductor dies are generally mounted on lead frames for coupling to external circuitry. Such lead frames are arranged consecutively in a long strip. A fragmentary portion of such a lead frame strip showing one lead frame (80) is illustrated in FIG. 5 The lead frame (80) has a die paddle (81) to which a die (83) is secured, and a plurality of lead frame fingers radically disposed in a finger zone (82) around the die paddle (81). The die paddle (81) is not connected with the finger zone (82) but supported by four interconnection strips (810) provided at four corners of the die paddle (81), respectively. As the die (83) is secured to the die paddle (81), a thermal board (90) and a position board (84) have to be employed to bond wires between the die (83) and the lead frame (80) so that the die (83) is electrically connected to the lead frame fingers of the finger zone (82).

The thermal board (90) is of a rectangular shape. A shallow slot (91) is defined in a flat upper face of the thermal board (90). The shallow slot (91) has a dimension just to fit the die paddle (81) of the lead frame (80). At four corners of the shallow slot (91), there are four position slot (910) defined for corresponding to the interconnection strips (810). When the lead frame (80) is placed on the thermal board (90), as shown in FIG. 6, the die paddle (81) is received in the shallow slot (91) and the lower face of the die paddle (81) directly contacts with the bottom face of the shallow slot (91). Each interconnection strip (810) of the lead frame (80) is received in a corresponding position slot (910) so that the die paddle (81) and the finger zone (82) can be located in a proper position. Then, the position board (84) is suppressed on the lead frame (80) to further securely locate the die paddle (81) and the finger zone (82). The position board (84) has an operation window (840) defined in such a manner that the die paddle (81) and the inner portion of the finger zone (82) are exposed via the operation window (840).

After the lead frame (80) is secured to the thermal board (90) by suppressing the position board (84) onto the lead frame (80). Wire bonding process can be executed to bond wires from the die (83) to the corresponding lead frame fingers of the finger zone (82). To increase the efficiency of wire bonding process, the thermal board (90) has to be heated so that heat can be transferred from the thermal board (90) to the finger zone (82) of the lead frame (80). As a result, the finger zone (82) is heated to a high temperature status and the wires extended from the die (83) can be easily welded to the lead frame finger.

It is known that the higher the temperature of the thermal board (90) is, the easier the wire bonding process is. However, the high temperature of the thermal board (90) may cause a problem to the semiconductor manufacturing process. Such a problem raised because the lead frame (80) is made of copper that is easy to be oxidized in high temperature. As the die paddle (81) of the lead frame (80) is corresponding to the shallow slot (91) of the thermal board (90) and directly contacts with the bottom face of the shallow slot (91), the die paddle (81) is also heated when the finger zone (82) is heated by the thermal board (90). Therefore, the die paddle (81) is likely to be oxidized, especially when the thermal board (90) is heated to have a temperature of about 200° C. Such an oxidized paddle (81) suffers a disadvantage that it may be delaminated from an encapsulant after packaging in a semiconductor device. Therefore, the increase of the temperature to the thermal board (90) is restricted and the wire bonding efficiency can not be enhanced. Accordingly, there is a desire to have a thermal board which can provide high temperature to increase the wire bonding efficiency while preventing the die paddle from being oxidized.

SUMMARY OF THE INVENTION

The object of the present invention is to provide a thermal board used for bonding wires in semiconductor manufacturing process for providing high temperature to increase the wire bonding efficiency while preventing the die paddle of a lead frame from being oxidized.

In accordance with one aspect of the present invention, a thermal board is provided, which has a base board and a platform disposed on the base board. The platform has a center portion defined therein a chamber to receive the die paddle. A plurality of supporting posts are formed on the bottom of the chamber to support the die paddle.

In accordance with another aspect of the present invention, a thermal board is provided, which has a base board having an upper face defined therein a chamber (23) to receive the die paddle, and a plurality of supporting post formed on the bottom of the chamber to support the die paddle.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
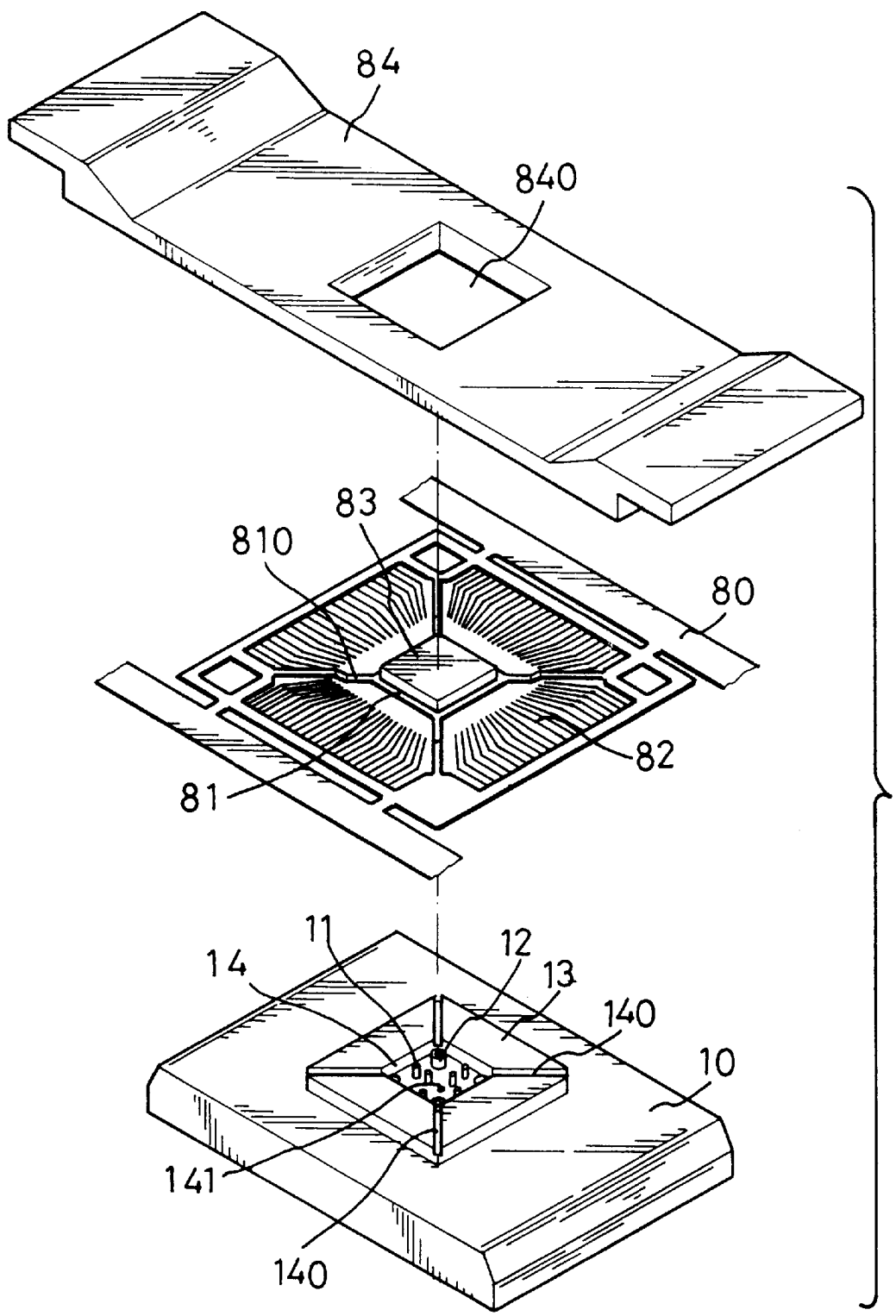
FIG. 1 is a perspective view showing the use of a thermal board in accordance with a first preferred embodiment of the present invention.

FIG. 1 schematically illustrates a thermal board (1) in accordance with a preferred embodiment of the present invention and a position board (84) to bond wires between a die (83) and a lead frame (80). As known in the prior art, the die (83) is disposed on a die paddle (81) of the lead frame (80), and the lead frame (80) has four interconnection strips (810) to support the die paddle (81).

The thermal board (1) has a base board (10) which is preferably made of carbon steel to meet the requirement of high temperature operating environment. On the center portion of the upper face of the base board (10), a platform (13) is disposed and corresponds to the inner portion of the finger zone (82) of the lead frame (80) so as to support finger zone (82) and conduct heat thereto. The platform (13) has a center portion defined therein a chamber (14). The dimension of the chamber (14) is configured to just fit the die paddle (81) of the lead frame (80) so that the die paddle (81) can be hold in the chamber (14). On the bottom of the chamber (14), a plurality of supporting post (11,12) are formed to support the die paddle (81), and a ventilation hole (141) is defined through the base board (10) so that heat in the chamber (14) can be exhausted via said ventilation hole (141) when the base board (10) is heated. Furthermore, the platform (13) has four position slot (140) defined at four corners of the chamber (14), respectively, to receive the four interconnection strips (810) around the die paddle (81).

Figure 2:
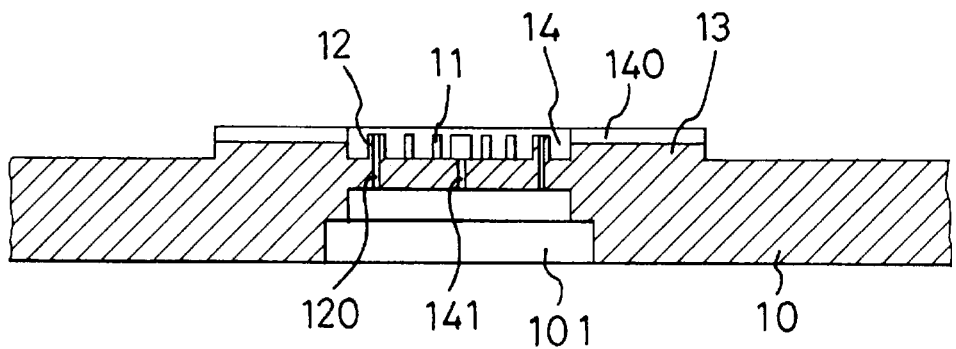
FIG. 2 is a cross sectional view of the thermal board in accordance with the first preferred embodiment of the present invention.
Figure 3:
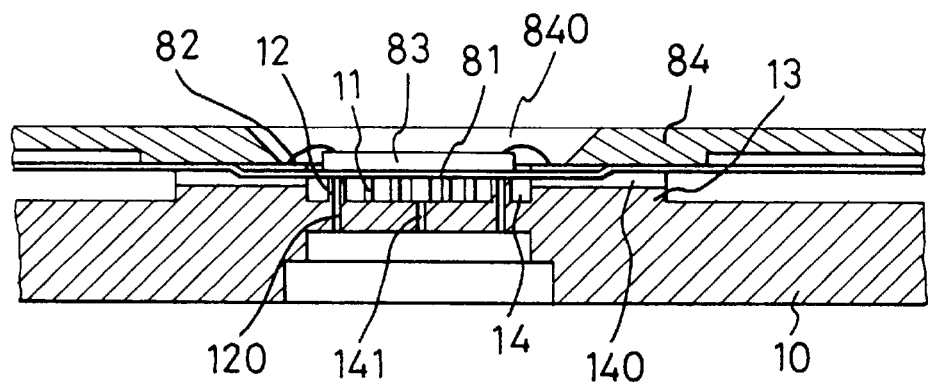
FIG. 3 is a cross sectional view showing the use of the thermal board in accordance with the first preferred embodiment of the present invention.
Figure 6:
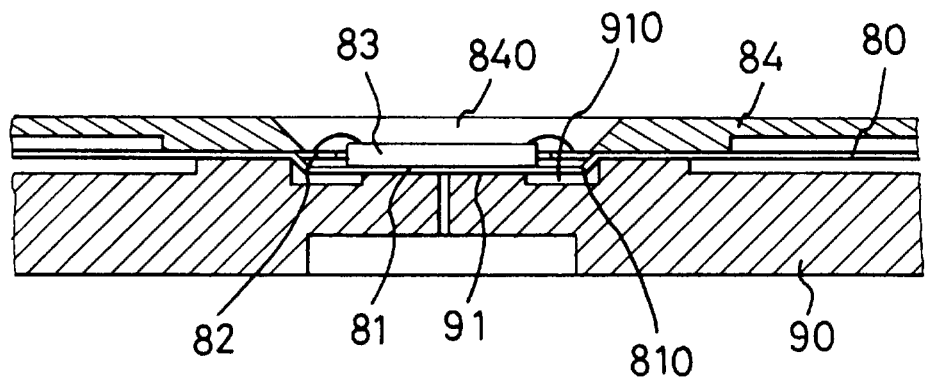
FIG. 6 is a cross sectional view showing the use of the conventional thermal board.

The plurality of supporting post (11,12) are formed at the center and corners of the chamber (14), wherein the supporting post (12) formed at corners of the chamber (14) are hollow, as shown in FIG. 2. That is, an axial channel (120) is defined through each of the supporting post (12). The channel (120) is extended through the base board (10) so that the supporting post (12) is capable of sucking the die paddle (81), in addition to supporting the die paddle (81), when air is exhausted out of the space (101) defined at a bottom portion of the base board (10) under the chamber (14), thereby further securely holding the die paddle (81).

In use of the thermal board (1) in accordance with the present invention, the lead frame (80) is positioned on the surface of the base board (10). The inner portion of the finger zone (82) is closely attached to the surface of the base board (10). The die paddle (81) is received in the chamber (14) and supported by the plurality of the supporting post (11,12) so that the die paddle (81) does not directly contact with the bottom face of the chamber (14). After the lead frame (80) is located as described above, the position board (84) is suppressed on the lead frame (80) to further securing the lead frame (80).

Then, the base board (10) may be heated to a temperature of 200° C.–250° C. The heat of the base board (10) is transferred to the finger zone (82) of the lead frame (80) via the platform (13) to assist the wire bonding process. Furthermore, because the die paddle (81) is supported by the plurality of supporting posts (11,12) without directly contacting with the bottom of the chamber (14), there is only a limited amount of heat transferred to the die paddle via such a small contact area. Besides, because air is exhausted out of the space (101) under the base board (10) during wire bonding process, hot air in the chamber (14) can be exhausted via the ventilation hole (141) thereby decreasing the temperature of the die paddle (81). It is known that the temperature of the die paddle (81) can be controlled to be under 180° C. when the temperature of the base board (10) is up to 250° C. With such a controlled temperature, it is ensured that the bottom of the die paddle (81) is not oxidized so that the die paddle (81) will not delaminated from the encapsulant after packaging.

Figure 4:
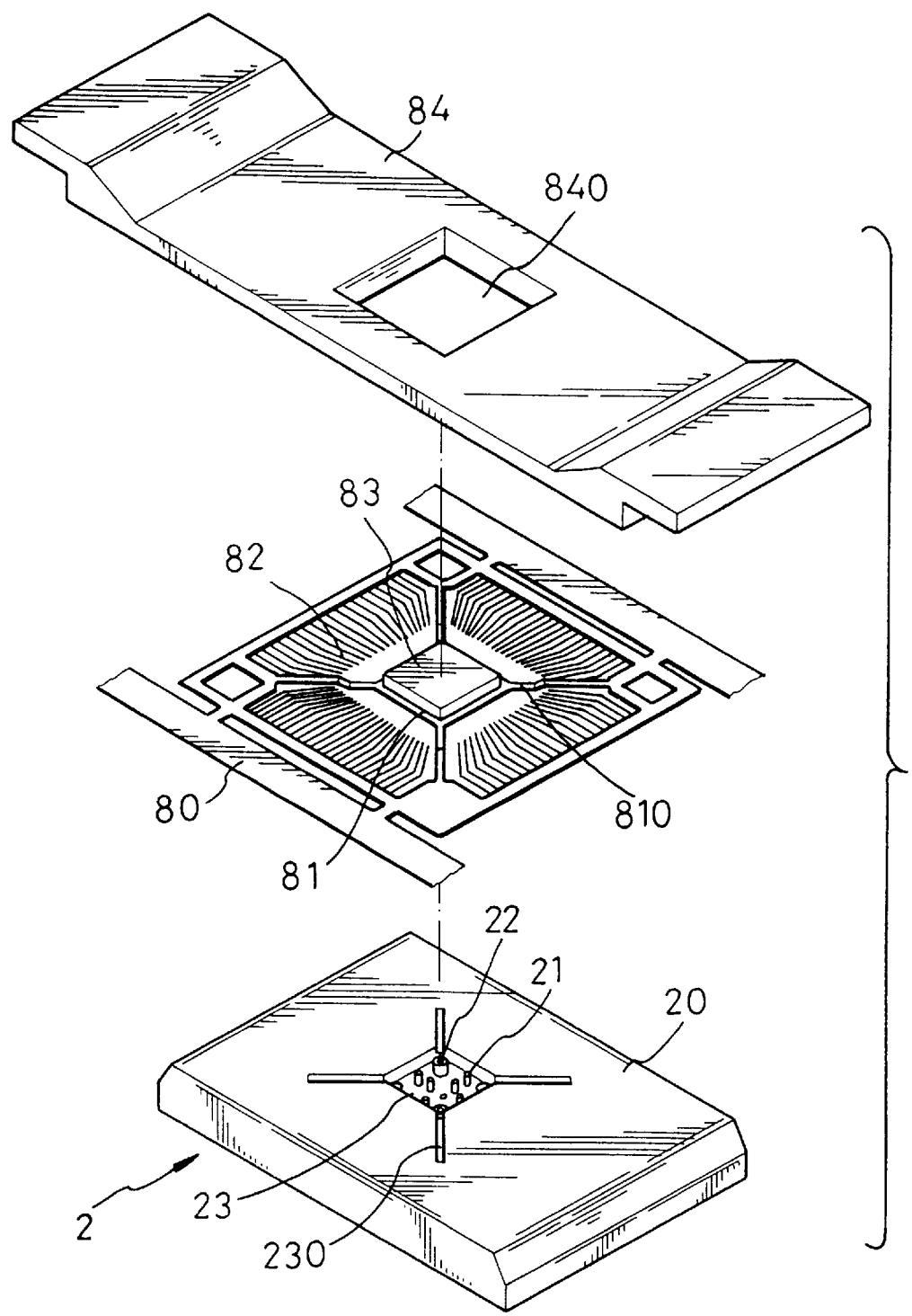
FIG. 4 is a perspective view showing the use of a thermal board in accordance with a second preferred embodiment of the present invention.
Figure 5:
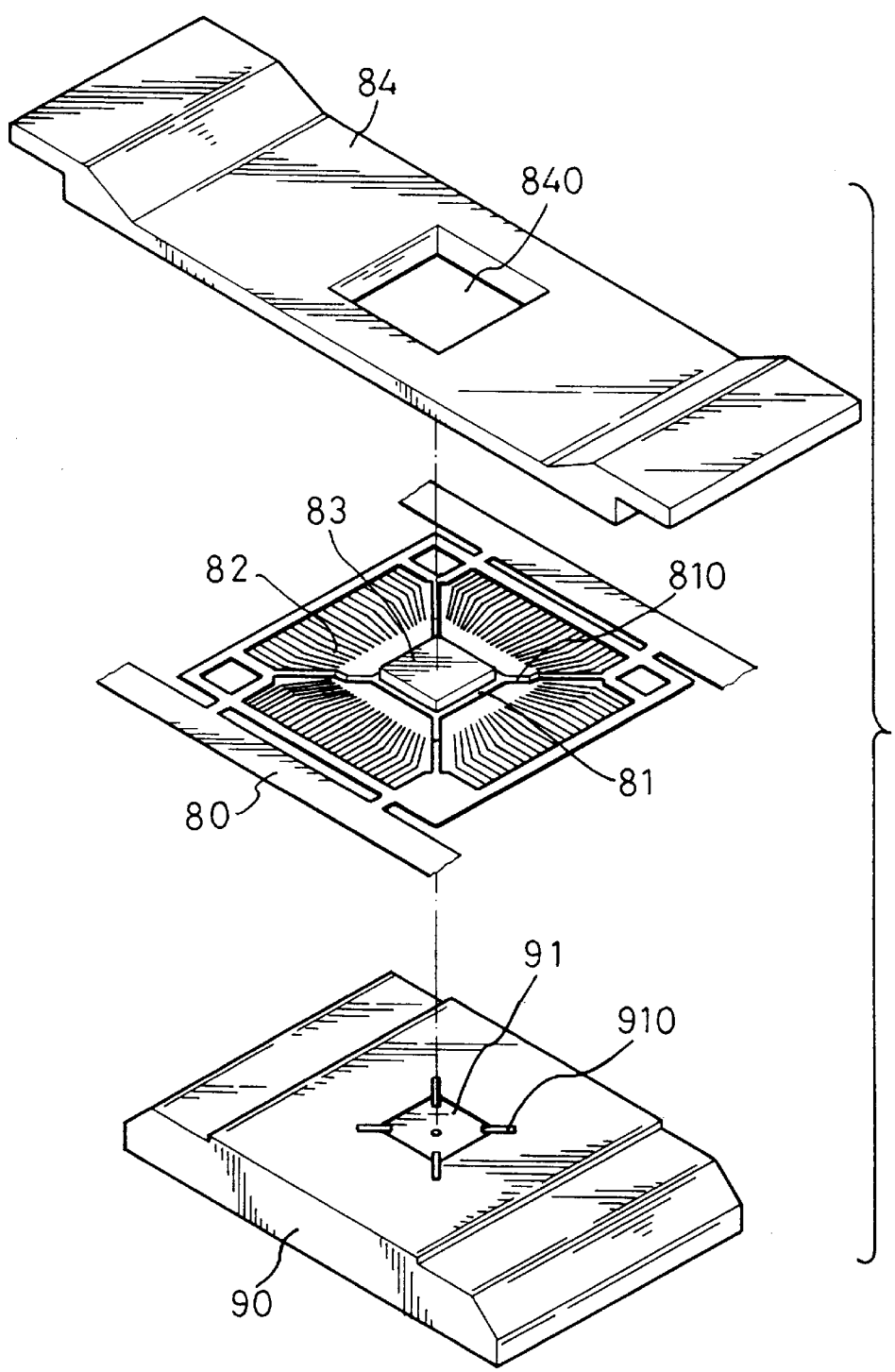
FIG. 5 is a perspective view showing the use of a conventional thermal board.

FIG. 4 shows another preferred embodiment of a thermal board (2) in accordance with the present invention, which has a base board (20) and a chamber (23) defined in the upper face of the base board (20) to receive the die paddle (81). On the bottom of the chamber (23), a plurality of supporting post (21,22) are formed to support the die paddle (81), and a ventilation hole (230) is defined through the base board (10). The structure and arrangement of the supporting posts (21,22) are the same as those of the previous embodiment. In use of such a thermal board (2), the finger zone (82) of the lead frame (80) directly contacts with the upper surface of the base board (20) and the die paddle (81) is hold in the chamber (23) and supported by the plurality of supporting posts (21,22). Accordingly, similar effect in controlling the temperature of the die paddle (81) can be achieved.

Although the present invention has been explained in relation to its preferred embodiment, it is to be understood that many other possible modifications and variations can be made without departing from the spirit and scope of the invention as hereinafter claimed.

What is claimed is:

1. A thermal board for bonding wires between a die (83) and a lead frame (80) in semiconductor manufacturing process, said die (83) being disposed on a die paddle (81) of said lead frame (80), said thermal board comprising:

a base board (10);

a platform (13) disposed on said base board (10), said platform (13) having a center portion defined therein a chamber (14) adapted to receive said die paddle (81); and a plurality of supporting posts (11,12) formed on a bottom of said chamber (14) adapted to support said die paddle (81).

2. The thermal board as claimed in claim 1, wherein said lead frame (80) has four interconnection strips (810) to support said die paddle (81) and said platform (13) has four position slot (140) defined at four corners of said chamber (14), respectively, adapted to receive said four interconnection strips (810).

3. The thermal board as claimed in claim 1, wherein said bottom of said chamber (14) defines a ventilation hole (141).

4. The thermal board as claimed in claim 1, wherein said plurality of supporting post (11,12) are formed at the center and corners of said chamber (14), said supporting post (12) formed at corners of said chamber (14) being hollow.

5. The thermal board as claimed in claim 1, wherein said base board (10) is made of carbon steel.

6. A thermal board for bonding wires between a die (83) and a lead frame (80) in semiconductor manufacturing process, said die (83) being disposed on a die paddle (81) of said lead frame (80), said thermal board comprising:

a base board (20) having an upper face defined therein a chamber (23) adapted to receive said die paddle (81); and a plurality of supporting posts (21,22) formed on a bottom of said chamber (23) adapted to support said die paddle (81).

7. The thermal board as claimed in claim 6, wherein said lead frame (80) has four interconnection strips (810) to support said die paddle (81) and said base board (20) has four position slot (230) defined at four corners of said chamber (23), respectively, adapted to receive said four interconnection strips (810).

8. The thermal board as claimed in claim 6, wherein said bottom of said chamber (14) defines a ventilation hole (?).

9. The thermal board as claimed in claim 6, wherein said plurality of supporting post (21,22) are formed at the center and corners of said chamber (23), said supporting post (22) formed at corners of said chamber (23) being hollow.

10. The thermal board as claimed in claim 6, wherein said base board (20) is made of carbon steel.

* * * * *